United States Patent [19]

Iantosca

[11] Patent Number: 5,296,268
[45] Date of Patent: Mar. 22, 1994

[54] PRETREATMENT PROCESS OF TIN LEAD PLATING

[75] Inventor: Richard A. Iantosca, W. Palm Beach, Fla.

[73] Assignee: Shipley Company Inc., Marlborough, Mass.

[21] Appl. No.: 753,787

[22] Filed: Sep. 3, 1991

[51] Int. Cl.$^5$ .............................................. B05D 3/00
[52] U.S. Cl. ...................................... 427/328; 427/98; 427/437
[58] Field of Search ............... 427/304, 328, 437, 433, 427/98; 106/1.22, 1.25

[56] References Cited

U.S. PATENT DOCUMENTS

| | | | |
|---|---|---|---|
| 2,282,511 | 5/1942 | Bradley | 427/437 |
| 4,027,055 | 5/1977 | Schneble, Jr. | 106/1.25 |
| 4,085,066 | 4/1978 | Gulla | 427/304 |
| 4,093,466 | 6/1978 | Davis | 106/1.22 |
| 4,194,913 | 3/1980 | Davis | 106/1.22 |
| 4,234,631 | 11/1980 | Davis | 427/436 |
| 4,322,451 | 3/1982 | Emerson et al. | 427/304 |
| 4,328,266 | 5/1982 | Feldstein | 427/437 |
| 5,104,688 | 4/1992 | Ferrier et al. | 427/436 |

FOREIGN PATENT DOCUMENTS 0180265 10/1985 European Pat. Off. .
0276518 12/1987 European Pat. Off. .

*Primary Examiner*—Shrive Beck
*Assistant Examiner*—Katherine A. Bareford
*Attorney, Agent, or Firm*—Robert L. Goldberg

[57] ABSTRACT

A process for plating a tin-lead alloy on a substrate by displacement plating from an immersion plating solution containing dissolved tin and lead. The process includes the steps of pretreatment of a substrate by contact with a solution containing a pH adjustor for said immersion deposition solution followed by contact of the substrate with said immersion plating solution for a time sufficient to deposit an alloy of tin and lead.

22 Claims, No Drawings

PRETREATMENT PROCESS OF TIN LEAD PLATING

BACKGROUND OF THE INVENTION

1. Introduction

This invention relates to immersion solder deposition and more particularly, to pretreatment of a substrate prior to immersion solder deposition to provide uniform deposits from a solder depositing solution over the useful life of the deposition solution. The invention is especially useful for the manufacture of printed circuit boards.

2. Description of the Prior Art

Tin-lead alloy having a composition of between 60 and 65 percent tin and 35 to 40 percent lead (solder) is coated onto copper traces in the manufacture of printed circuit boards. The alloy may function as an etch resist and permits attachment of components to a circuit board. For this latter use, the alloy must melt and reflow at a reasonably low temperature to avoid damage to the circuit during heating of the board and must have an adequate thickness for surface mounting of components.

Conceptually, there are four methods available for coating tin-lead alloys onto copper traces in printed circuit manufacture. These methods include (1) hot air leveling, (2) electroless plating, (3) immersion plating and (4) electroplating. Each process has advantages and disadvantages and the metal deposit obtained from each differs from the deposit obtained by other plating methods. The invention described herein is a process sequence for immersion deposition of tin-lead alloys.

Immersion plating is a process where deposition is by displacement of elemental metal from a substrate by metal ions in a plating solution. Since plating is by displacement, immersion plating is an electrochemical reaction that depends upon the position the substrate metal occupies in the electromotive series relative to the metal to be deposited from solution. Plating occurs when the metal from a dissolved metal salt is displaced by a more active (less noble) metal immersed in the solution. Since copper is more noble than tin or lead, copper would not be expected to be plated by an immersion process to give a tin-lead deposit. However, when complexed under acidic conditions, the electropotentials of the tin and lead complexes relative to copper reverse making immersion plating possible.

Limitations in the use of immersion plating for circuit fabrication exist. These include a slow plating rate, difficulty in obtaining a desired alloy, limited deposit thickness, changes in deposit properties over an extended use of the plating solution and difficulty in obtaining a deposit suitable for reflow. Limited thickness is due to the plating reaction being self-limiting because as the coating builds, the metal deposited from solution masks the underlying base metal which functions as the reducing agent and is required for displacement. Additionally, as the displaced base metal is dissolved in solution, it becomes a contaminant progressively slowing the rate of displacement. Typical deposit thickness for an immersion tin deposit in the prior art is 50 to 100 microinches, mainly because of the foregoing problems. Further, as immersion deposition continues, the concentration of components in the solution changes through reaction, plate-out of metals, "drag in" of solution contaminants and drag out of solution components. Since the immersion deposition solution must be carefully controlled to obtain uniform deposits, small changes in solution composition can result in major changes in deposit properties.

Absent the above disadvantages, there would be advantages to immersion plating compared to other methods for depositing tin-lead alloy in circuit manufacture. Compared to electroless and electroplating, there is no hydrogen generation during the plating process and no concomitant pitting or other discontinuities in the deposit. Also, immersion plating is not subject to surface roughness as found in electroplating processes due to "drag-over" from precleaners, anode corrosion and the like. Further, since electroless baths contain both a metal to be plated and a reducing agent, the bath is potentially unstable subject to spontaneous plating. In immersion plating, there is no problem with spontaneous plating. Moreover, with immersion plating, neither an electrically continuous circuit nor attachments of electrical contacts are required nor is there a need to maintain a precise current. Finally, an immersion deposit is generally uniform in thickness.

It is known in the art that to be suitable for printed circuit board manufacture, a tin-lead alloy deposit over copper circuit lines must be pore free, reasonably thick, should possess a uniform cross section and should be bondable to subsequently attached components. It is also known that as metal is deposited onto a substrate from solution in a plating process, the deposit obtained is often not coherent and may contain numerous pores due to the nature of the plating reaction. Coherency is obtained and pores are eliminated in a tin-lead alloy deposit by heating the board with the alloy deposit to a temperature in excess of the alloy's melting point whereby the deposit melts and pores are eliminated by reassembly of the deposit, a process known in the art as "reflow". To reflow a tin-lead alloy, the tin-lead alloy should melt at a relatively low temperature to avoid damage to the circuit by heating to an excessively high temperature and the deposit must be adequately thick. A thin deposit will not reflow and may not contain the minimum mass of metal required to bond a component to a circuit board, particularly if the component is surface mounted on the board. To obtain a low melting tin-lead alloy, the deposit desirably has a concentration of tin and lead at or close to the low melting eutectic of tin and lead (approximately 63% tin and 37% lead by weight—i.e., solder).

In spite of the potential advantages of immersion plating, the prior art generally dismissed immersion plating processes for printed circuit fabrication because the prior art believed that thick, bondable (solderable) deposits capable of reflow could not be obtained. As stated in *Printed and Integrated Circuitry*, McGraw Hill Book Company, Inc., New York, 1963 at page 138, (immersion deposits are) "limited in thickness, porous, and often poorly adherent and, therefore, of limited interest". The self-limiting feature and thickness of immersion tin and lead plating procedures were believed to make soldering impossible and consequently, plating baths for immersion deposits of tin and lead were of minimal interest to the art.

In U.S. Pat. No. 4,194,913, incorporated herein by reference an immersion plating composition is disclosed for deposition of tin-lead alloys. In accordance with the teachings of this patent, an immersion plating solution is disclosed comprising stannous chloride, lead chloride, sodium hypophosphite, thiourea, hydrochloric acid and gelatin. In this patent, patentee states that the plating composition provides a faster plating rate and a deposit of increased thickness. Though it is believed that improved immersion deposits are obtained using the compositions of the patent, it is believed that the deposits are unsuitable for the commercial manufacture of printed circuit boards.

In European published application No. 0 167 949, also incorporated herein by reference, an immersion plating solution is disclosed that may contain a tin and lead salt of a fluorine containing mineral acid, a fluorine containing mineral acid sufficient to provide a pH up to 0 and 1, and a sulfur containing complexing agent such as thiourea. An example of a tin-lead plating solution is given though it is believed that thick, reflowable deposits of tin and lead are not obtained and the compositions are believed to be unsuitable for the circuit fabrication.

In copending U.S. Pat. Application Ser, No. 07/532,819 filed Jun. 4, 1990, now abandoned, assigned to the assignee hereof and incorporated herein by reference, an immersion plating solution capable of plating a thick, porous, adherent tin-lead alloy deposit capable of low temperature reflow is disclosed. The invention of said application was based on a combination of discoveries. For example, it was found for deposit reflow, the deposit had to be thick and porous—i.e., at least 100 microinches and preferably 150 microinches or greater. Also, to obtain a thick deposit, the plating solution should favor a porous structure—not a dense deposit. To obtain such a deposit, the solution should contain a high metal content—i.e., in excess of 0.10 moles per liter with a tin to lead ratio of at least 1 to 1. Further, the tin salt, the lead salt, and the acid used to adjust pH should desirably contain a fluorine anion. Recognizing that the displacement reaction favored tin, a lead promoter was added to solution to maintain concentration of lead relative to tin. It was also found that dissolved copper was a desired component to promote plating rate. Finally, exaltants are added to solution.

Following deposition of a tin-lead alloy from the immersion plating solution described above, the deposit formed had a crystalline porous structure with alternating layers of lead and tin and was capable of reflow by heating to a temperature above the deposit melting point for a time sufficient to form a dense coherent coating. After reflow, the alloy was dense and shiny and believed to be a true homogeneous alloy of tin and lead.

The immersion deposition composition of the copending application provided solder alloys suitable for the manufacture of printed circuit boards. However, as should be evident from the discussion set forth above, the solution required operation within restricted concentrations and conditions to obtain deposits suitable for use in circuit manufacture and suitable for reflow. Variations in the conditions or composition of the immersion depositing solution resulted in changes in the deposit obtained and consequently, lack of uniformity from deposit to deposit during use of the plating solution over a prolonged time.

SUMMARY OF THE INVENTION

The present invention provides a pretreatment process that avoids drag in of contaminants to an immersion plating solution for deposition of tin-lead alloys while replenishing certain solution components if desired. By avoidance of contaminants in accordance with the invention, and with standard replenishment of the solution, the useful life of the deposition solution is extended and deposits obtained during prolonged use of the solution are uniform from deposit to deposit.

The process of the invention is characterized by a pretreatment step performed immediately preceding contact of a part to be plated with the immersion plating solution. The pretreatment step comprises rinsing of the part to be plated with a solution containing at least pH adjustors and buffers compatible with those contained in the plating solution either in lieu of the conventional water rinse or subsequent to the same. Followng this pretreatment step, the part is then contacted with the immersion plating solution, without use of an intermediate step of water rinsing if desired. In this way, only solution components from the pretreatment solution are dragged into the immersion plating solution, and in a preferred embodiment of the invention, in an amount approximating the amount lost from solution by drag out. This assures a uniformity in at least solution pH during use, avoids drag in of contaminants into the plating solution and thereby contributes to deposits uniformity from part to part during extended use of the plating solution.

DESCRIPTION OF THE PREFERRED EMBODIMENTS

In accordance with the invention disclosed herien, an immersion tin-lead alloy is deposited on a substrate in conventional manner using the novel pretreatment step disclosed herein coupled with conventional deposition procedures known in the art. The immersion deposit is preferably deposited to a thickness in excess of 100 microinches to assist reflow following the procedures of this invention. The preferred immersion deposit is plated from plating solutions such as those disclosed in copending U.S. Patent Application 07/532,819 referenced above.

Preferred tin-lead alloy plating solution for use in the process of the invention s disclosed in U.S. Pat. application 07/532,819 has the following composition:

TABLE I

| Component | Broad Range | Preferred Range |
|---|---|---|
| $Sn^{++}$ | 0.05 to 0.50 moles/liter | 0.10 to 0.30 moles/liter |
| $Pb^{++}$ | 0.01 to 0.15 moles/liter | 0.02 to 0.10 moles/liter |
| $Sn^{++} + Pb^{++}$ | 0.05 to 0.60 moles/liter | 0.10 to 0.35 moles/liter |
| Ratio $Sn^{++}:Pb^{++}$ | 1.0:3.0 to 50.0:1.0 | 1.0:1.0 to 10.0:1.0 |
| Complexing agent | 0.05 to 2.50 moles/liter | 0.50 to 2.00 moles/liter |
| Lead Promoter | 0.00 to 0.60 moles/liter | 0.05 to 0.25 moles/liter |
| pH controller | to pH 0 to 1.5 | to pH 0 to 1.2 |
| Thickness promoter | 0.00 to 1.00 moles/liter | 0.001 to 0.20 moles/liter |
| Buffer | to maintain pH | to maintain pH |
| Water | to 1 liter | to 1 liter |

The stannous and plumbous ions are provided to the bath in the form of a solution soluble salt, preferably of a fluorine containing acid. Suitable sources of the salt include tin fluorides, fluoroborate or fluorosilicates. Preferred sources for both are their respective fluoroborate salts. The concentrations of tin and lead in solution are given in Table I. These concentrations are believed to be high compared to that which are known in the art. The high concentration contributes to a rapid rate of deposition and a porous deposit having a thickness prior to reflow of at least 100 microinches. A thick deposit promotes reflow and is desirable for surface mounting of components to the board. The ratio of the tin to lead ions is also given in Table I. This ratio permits deposition of alloys with tin ranging between 50 and 82 percent and lead ranging between 50 and 18 percent. The preferred solutions deposit alloys with tin ranging between about 56 and 74 percent and lead ranging between 44 and 26 percent.

The plating solutions contain a complexing agent in an amount at least sufficient to complex all of the metal in solution and preferably in an amount in excess of the amount required for complete complexation of all metal present in solution. The broad and preferred ranges for the concentration of the complexing agent are given in Table I. The complexing agent used is one preferably capable of complexing both tin and lead ions. Sulfur containing complexing agents are preferred, especially a compound containing sulfur and nitrogen such as thiourea or a substituted thiourea such as tetramethyl thiourea or allyl thiourea.

Tin plates from solution at a more rapid rate than lead. To avoid deposition of an alloy with an undesirably high tin content, a component is added to the plating solution that promotes the rate of lead deposition relative to tin by changing the displacement potential of each. Suitable lead promoters include hypophosphorous acid, sodium hypophosphite, glycerin, urea, amino acetic acid, etc. Hypophosphorous acid and sodium hypophosphite are preferred. The concentration of the lead promoter is given in Table I. Though ranges are given, the relative rate of codeposition of tin and lead is subject to variables such as solution pH, solution temperature and the total combined metals content of the solution.

The immersion plating solutions are acidic and have a pH between about 0.2 to 2.0. Any solution compatible acid may be used to acidify the solution, but desirably, the acid has a anion common to the acid salts of tin and lead. Therefore, fluorine containing acids such as hydrofluoric acid, fluoroboric acid and fluorosilic acid are suitable with fluoroboric acid being most preferred.

A thickness promoter is used in the immersion plating solution. Solution soluble salts of a metal of the Group IVb, Vb or VIb of the periodic table of the elements are suitable. Such metals include molybdenum, zirconium, titanium, chromium, vanadium, etc. Titanium added in the form of titanium trichloride dissolved in hydrochloric acid constitutes a preferred thickness promoter. The titanium ion concentration is given in Table I.

Chloride ion is another desirable additive in solution to promote deposit thickness. The chloride ion concentration preferably varies between 0 and 0.5 moles per liter and more preferably, between 0.0001 and 0.20 moles per liter.

An additional desirable component in the solution is a fluorine containing acid, and preferably fluoroboric acid in minor amount sufficient to provide the required pH as set forth in Table I.

Another immersion tin-lead immersion deposit that can be made to reflow in deposits in excess of 100 microinches following procedures of copending U.S. Pat. application Ser. No. 07/733,705 and assigned to the same assignee as the subject application is disclosed in Re. 30,434 reissued Nov. 11, 1980 incorporated herein by reference. A preferred immersion depositing solution, in accordance with this patent, comprises stannous chloride in a preferred amount of from 20 to 40 grams per liter, lead chloride in an amount of from 2 to 15 grams per liter, sodium hypophosphite in an amount of from 10 to 100 grams per liter, thiourea in an amount of from 40 to 100 grams per liter, hydrochloric acid in an amount of from 40 to 100 grams per liter and gelatin in an amount of from 1 to 4 grams per liter. To enable the immersion deposit to reflow, a thick deposit is plated and then treated with an immersion tin plating solution as disclosed in the above referenced copending application.

Other than the pretreatment step disclosed herein, the immersion plating solutions are used in conventional manner. A substrate having a cupreous surface is prepared for deposition by cleaning and etching the cupreous metal with an etchant such as ammonium bifluoride - hydrogen peroxide or sodium persulfate - sulfuric acid. Thereafter, the substrate is treated with the solutions of the invention which contain materials common to or compatible with those of the immersion deposition solution, especially pH controlling additives such as an acid and buffer, preferably the same acid and buffer present in the immersion plating solution. Therefore, if the immersion plating solution uses fluorine containing acids such as hydrofluoric acid, fluoroboric acid and fluorosilic acid or fluorine containing metal sources such as stannous and plumbous fluoroborate, acids having a common anion are preferred components of the pretreatment solution. A typical buffer found in the immersion plating solution is boric acid and a buffer is a desired component of the pretreatment solution disclosed herein. Other additives may include lead promoter, thickness promoters, complexing agent, etc. though the preferred embodiment of the invention comprises a pretreatment solution containing only pH adjustor and buffer in an amount substantially equivalent to the amount lost by drag out from parts passing through the solution.

The amount of each additive contained in the pretreatment solution is desirably that amount that maintains the concentration of the components of the immersion plating solution essentially constant and preferably should be essentially equivalent to that amount lost by drag out. For example, if the pH of the plating solution is about 0.5, the amount of acid in the pretreatment solution should be that amount needed to hold the pH of the solution constant during the passage of parts into the pretreatment solution and through the immersion plating solution. Preferably, the pH adjustor should be a fluorine containing acid in a concentration sufficient to maintain a pH not exceeding 1.0.

A preferred pretreatment solution prepared for use with the immersion depositing solutions of the copending application would have a composition as follows:

| Component | Preferred Material | Broad Range | Preferred Range |
| --- | --- | --- | --- |
| Acid (ml/l) | Fluoroboric acid | 5.0 to 50.0 | 8.0 to 20.0 |
| Buffer (gm/l) | Boric acid | 0.0 to 25.0 | 1.0 to 10.0 |
| Complexing Agent (gm/l) | Thiourea | 0.0 to 25.0 | 0.0 to 5.0 |
| Lead Promoter (gm/l) | Hypophosphite or hypophosphorus acid | 0.0 to 3.0 | 0.0 to 1.0 |
| Exaltant (gm/l) | Titanium chloride | 0.0 to 0.5 | 0.0 to 0.2 |

An exemplary pretreatment solution is as follows:

EXAMPLE 1

| | |
|---|---|
| Fluoroboric acid (ml) | 15.0 |
| Boric acid (gm) | 8.0 |

After treatment with the pretreatment solution of the invention, such as by spray rinsing, immersion, etc., for a time sufficient to remove treatment chemicals from prior steps, such as 30 seconds to 5 minutes, the substrate is contacted with the immersion plating solution, without an intermediate water rinse if desired.

The substrate is then immersed in the immersion plating solution for a time sufficient to form a tin-lead deposit having a thickness of at least 100 microinches and preferably ranging between 150 and 350 microinches. Typically, the plating time required to obtain such a deposit is between about 10 and 30 minutes. As is known in the art, plating temperature affects the rate of deposition and deposit thickness. Plating temperatures typically range from about room temperature to close to the boiling point of the plating solution but temperatures of from about 100° F. to about 175° F. are typical.

Using the plating solutions of the copending application referenced above, the deposits formed are porous and matte gray in color with an observable sparkle dispersed throughout the deposit. Deposits having the visible sparkle are readily reflowed. The deposits are non homogeneous and are known to be layered.

Following the deposition of tin-lead alloy, the immersion tin-lead deposit may be plated with immersion tin and then reflowed in conventional manner. Reflow involves heating the alloy above its melting point and holding the alloy at this temperature for a short period of time, typically for less than one minute. A preferred method involves floating a part with the tin-lead and tin deposits on hot oil. Prior to reflow, the part is preferably warmed and following reflow, the part is preferably quenched at elevated temperature, all in accordance with conventional practice in the art. It is a characteristic of the tin-lead deposit that deposits having a thickness of less than about 100 microinches are difficult to reflow. In addition, it is believed that prior to the invention disclosed herein and that of the copending application referenced above, immersion deposits of lead and tin and capable of reflow were not in commercial use and may not have been known in the art.

The invention will be better understood by reference to the examples that follow:

EXAMPLE 2

The following immersion tin-lead solution was used for purposes of illustration. Solution components are in grams per liter of solution unless otherwise indicated. Plating conditions are set forth in the example.

| | |
|---|---|
| Stannous fluoroborate | 46.0 |
| Plumbous fluoroborate | 15.0 |
| Fluoroboric acid | 5.0 |
| Thiourea | 85.0 |
| Hypophosphorous acid | 9.2 |
| Boric acid | 6.0 |
| Titanium trichloride | 1.0 |
| Hydrochloric acid | 0.05 |
| Dissolved copper | 0.01 |
| Water | to 1 liter |
| Solution pH | 0.8 |
| Plating temperature | 71.0° C. |

-continued

| | |
|---|---|
| Plating time | 10 minutes |

Copper clad epoxy glass laminate was prepared for plating by immersion in an acid soak cleaner, a copper microetch, an acid activator, and then with the formulation of Example 1 followed by rinsing after each treatment except following immersion in the formulation of Example 1 where the rinse step is omitted. A part was then immersed into the plating solution for a period of 10 minutes. The deposit thickness was found to be 207 microinches and was matte gray and sparkling in appearance. The deposit was reflowed by fluxing, warming at 250° F. in oil for about 20 seconds, reflowed in hot oil at 400° F. for 20 seconds and quenched in oil at 250V F. The parts were then rinsed, cleaned and dried and found to contain 67 percent by weight tin and 33 percent by weight lead, a composition close to the tin-lead solder eutectic.

I claim:

1. A process for plating a tin-lead alloy on cupreous substrates by displacement plating from an immersion plating solution having a pH varying between 0.0 and 1.5 containing dissolved tin and lead salts, said process comprising the steps of pretreatment of the substrates by contact of the substrates with a pretreatment solution containing an acid pH adjustor followed by contact of the substrates with said immersion plating solution for a time sufficient to deposit an alloy of tin and lead by displacement of copper by tin and lead, said pretreatment solution containing said acid pH adjustor in a concentration sufficient to maintain the pH of the immersion plating solution essentially constant by drag in of pretreatment solution on substrates as they pass from the pretreatment solution to the immersion plating solution in said steps of contact of the substrates with said pretreatment solution and said immersion plating solution.

2. The process of claim 1 where the substrates are immersed in the immersion plating solution following treatment with the pretreatment solution without an intermediate treatement step.

3. The process of claim 1 where the acid pH adjustor in the pretreatment solution has an anion common to a member selected from the group of anions of a metal in the immersion plating solution or an acid in the immersion plating solution used to provide required pH.

4. The process of claim 3 where the pretreatment solution contains a pH buffer in addition to the acid pH adjustor.

5. The process of claim 3 where the acid pH adjustor is a fluorine containing acid.

6. The process of claim 3 where the pretreatment solution and the immersion plating solution each contain a fluorine containing anion.

7. A process for continuously plating cupreous substrates with a tin-lead alloy deposit of uniform concentration and sturcture from substrate to substrate by displacement plating from an immersion plating solution having a pH varying between 0.0 and 1.5 containing dissolved stannous and plumbous ions and members selected from the group of lead promoters, complexing agents for tin and lead, exaltants and mixtures thereof, said process comprising the steps of pretreatment of the substrates by contact of the same with a pertreatment solution containing an acid pH adjustor followed by contact of the substrates with said immersion plating solution for a time sufficient to deposit an alloy of tin and lead by displacement of copper by tin and lead, said pretreatment solution containing said acid pH adjuster in an amount sufficient to maintain the pH of the immersion plating solution essentially constant by said steps of contact of the substrates with said pretreatment solution and said immersion plating solution by drag in of pretreatment solution on said substrates in said immersion plating solution.

8. The process of claim 7 where the substrates are immersed in the immersion plating solution following treatment with the pretreatment solution without an intermediate treatement step.

9. The process of claim 7 where the acid pH adjustor in the pretreatment solution has an anion common to a member selected from the group of anions of a metal in the immersion plating solution or an acid in the immersion plating solution used to provide required pH.

10. The process of claim 9 where the pretreatment solution and the immersion plating solution each contain a fluorine containing anion.

11. The process of claim 9 where the pretreatment solution contains fluoroboric acid.

12. The process of claim 9 where the pretreatment solution contains a pH buffer in addition to the acid pH adjustor.

13. The process of claim 9 where the stannous ions and plumbous ions are in the immersion plating solution in the form of a salt of a fluorine containing acid.

14. The process of claim 9 where the tin-lead alloy deposit comprises layers of lead and tin and the deposit is reflowed on said substrates into a coherent alloy by heating said deposit to a temperature above the melting point of the alloy so formed but below a temperature that would damage the cupreous substrates.

15. The process of claim 7 where the acid pH adjustor is a fluorine containing acid in a concentration sufficient to maintain a pH not exceeding 1.0.

16. The process of claim 15 where the tin-lead alloy is deposited to a thickness of at least 100 microinches.

17. The process of claim 7 where the imemrsion plating solution contains stannous ions in an amount of from 0.05 to 0.50 moles per liter, plumbous ions in an amount of from 0.01 to 0.15 moles per liter, a total content of stannous ions and plumbous ions in an amount of from 0.05 to 0.60 moles per liter and a ratio of stannous ions to plumbous ions varying from about 1.0:3.0 to 50.0:1.0.

18. The process of claim 17 where the immersion plating solution contains stannous ions in an amount of from 0.10 to 0.30 moles per liter, plumbous ions are in an amount of from 0.02 to 0.10 moles per liter, the total content of stannous ions and plumbous ions ranges from 0.10 to 0.35 moles per liter and the ratio of stannous ions to plumbous ions varies from about 1.0:1.0 to 10.0:1.0.

19. The process of claim 17 where the immersion plating solution includes a sulfur containing complexing agent for the stannous ions and plumbous ions in an amount of from 0.50 to 2.50 moles per liter of solution.

20. The process of claim 17 where the complexing agent is thiourea.

21. The process of claim 17 where the immersion plating solution includes a promoter to the deposition of plumbous lead in an amount up to 0.60 moles per liter of solution.

22. The process of claim 17 where the immersion plating solution contains a thickness promoter.

* * * * *